United States Patent [19]
Hsue et al.

[11] Patent Number: 5,521,109
[45] Date of Patent: May 28, 1996

[54] METHOD FOR FABRICATING A HIGH COUPLING RATIO FLASH MEMORY WITH A VERY NARROW TUNNEL LAYER

[75] Inventors: Cheng-chiu Hsue; Gang Hong, both of Hsinchu City, Taiwan

[73] Assignee: United Microelectronics Corp., Taipei, Taiwan

[21] Appl. No.: 522,996

[22] Filed: Sep. 1, 1995

[51] Int. Cl.⁶ .................................................. H01L 21/8247
[52] U.S. Cl. .............................. 437/43; 437/44; 437/979
[58] Field of Search .................................. 437/30, 43, 44, 437/153, 154, 979; 148/DIG. 163

[56] References Cited

U.S. PATENT DOCUMENTS

| | | | |
|---|---|---|---|
| 5,153,144 | 10/1992 | Komori et al. | 437/44 |
| 5,225,362 | 7/1993 | Bergemont | 437/979 |
| 5,352,618 | 10/1994 | Larsen et al. | 437/43 |
| 5,453,393 | 9/1995 | Bergemont | 437/43 |

*Primary Examiner*—Chandra Chaudhari
*Attorney, Agent, or Firm*—Hamilton, Brook, Smith & Reynolds

[57] ABSTRACT

A method for fabricating a high coupling ratio flash memory includes the steps of forming a field oxide region and a gate oxide layer on the substrate; forming a silicon nitride layer on the gate oxide layer and defining a channel region under the gate oxide layer; forming two N⁻ shallow doping regions beside the channel region; forming a tunnel layer on the surface of each N⁻ shallow doping region; forming two insulator side wall layers respectively attached to two vertical sides of the silicon nitride layer and the gate oxide layer, with a portion of the tunnel oxide layer being covered by the two silicon nitride layers; removing a portion of the tunnel layer and leaving two very short tunnel oxide layers respectively covered by the two silicon nitride layers; forming a thick oxide layer on N⁺ source/drain regions substantially between the field oxide region and the insulator side wall layers, removing the silicon nitride layer and the insulator side wall layer; forming a first polysilicon layer on a portion of the thick oxide layer and the gate oxide layer; forming a dielectric layer and a second polysilicon layer.

7 Claims, 2 Drawing Sheets

METHOD FOR FABRICATING A HIGH COUPLING RATIO FLASH MEMORY WITH A VERY NARROW TUNNEL LAYER

BACKGROUND OF THE INVENTION

Field of the Invention

The present invention relates to a method for fabricating a high coupling ratio flash memory with a very narrow tunnel layer.

Memory technology has progressed considerably in recent years. High speed erasing is a popular method for improving the performance of a memory. Flash memories have a very high speed erasing feature in either an overall region or a local region thereof, therefore they are very popular in the computer field. For example, they are used to replace the read-only memories (ROMs) to store the firmware such as the BIOS (basic input output system), thus allowing the user to upgrade his/her BIOS by rewriting the flash memory, without the need of using another new memory. The flash memory has two layers of gates where an outer layer is a control gate and an inner layer is a float layer. The read/write manner of this flash memory is effected by means of electrons transferred between the float gate and source/drain gate. There is resulted in a coupling ratio which is defined as a ratio of an induced voltage on the float gate to the incident voltage applied on the flash memory. It is known that the higher the coupling ratio, the higher the efficiency of the flash memory. Conventionally, the coupling ratio is increased by increasing the areas of the opposite surfaces of the control gate and the float gate. However, for the high density requirement, the size of the memory chip is desired to be minimized, thus it is not easy to simultaneously minimize the size of the chip and still retain the coupling ratio in a high value.

It is known that NEC (an electrical company in Japan) has developed a new flash memory which has high density and high coupling ratio feature. The flash memory developed by NEC is made by a 0.4-micrometer procedure and is powered by a 3-volt voltage. This kind of flash memory defines a very small area of tunnel region (i.e., a thicker gate oxidizing layer relative to the channel region) between the float gate and the source/drain for decreasing the parasitic capacitance between the float gate and the substrate, thereby increasing the coupling ratio of the flash memory. The procedure for making the flash memory is described below by taking a reference to FIGS. 2A to 2F. Firstly, form a channel region as shown in FIG. 2A, where a local field oxidation procedure is performed on a P-type substrate to form a field oxide region FOX on the substrate, and overlapped layers of a gate oxide layer GOX, a first polysilicon layer 60, an oxidation layer OX, and a silicon nitride layer 50 formed on another portion of the substrate with a distance to the field oxide region FOX, thus defining a channel region under the gate oxide layer GOX. Secondly, perform an N$^+$ source/drain ions implanting step to form N$^+$ source/drain regions 5 in the substrate substantially around two sides under of the polysilicon 60; form two side walls of silicon nitride 51 respectively attached to two vertical sides of the polysilicon layer 60 via a silicon nitride deposition/reverse etching step; form thick oxide layers OX above the two N$^+$ source/drain regions 5. Thirdly, remove the silicon nitride layer 50, the side walls of silicon nitride 51, and grow a very thin silicon oxynitride tunnel 70 (about 75 Å) on an end portion of the N$^+$ source/drain regions 5, and deposit a second polysilicon layer 80 on the overall surface. Fourthly, remove portions of the polysilicon layer 80 and leave two side walls of a second polysilicon layer 81 attached to two vertical oxide walls OX which are attached to two vertical sides of the first polysilicon layer 60. Fifthly, remove the oxide layer OX on the top surface of the first polysilicon layer 60 and deposit a third polysilicon layer 82 on the overall surface, so that the third polysilicon layer 82 can integrate with the first polysilicon layer 60 and the second polysilicon layer 81 and forms a float gate P1 as shown in FIGS. 2E and 2F. Sixthly, deposit a dielectric layer ONO on the top surface of the float gate P1 and deposit a fourth polysilicon layer P2 which functions as a control gate P2 thus forming a flash memory.

The flash memory as formed above, utilizes the side wall of the silicon nitride 51 to automatically align to the end portion of the N$^+$ source/drain region 5, thus forming a very narrow tunnel region 70. Since a relatively thick gate oxide layer GOX isolates the float gate P1 from the substrate, a parasitic capacitance between the float gate P1 and the substrate is decreased considerably, therefore, the coupling rate is increased correspondingly. The two side walls of a second polysilicon layer 81 cause the recently formed float gate P1 and the control gate P2 to have an increased relative surface, thus increasing the coupling ratio.

However, the conventional flash memory suffers two drawbacks for establishing the high coupling ratio. Firstly, the conventional flash memory utilizes too many steps in forming different polysilicon layers thus resulting in the procedure to be very complicated and increasing cost. Secondly, since there are altogether four layers of polysilicon layers formed, the step height during the manufacture of the flash memory is correspondingly increased, which is not good for the flat requirement of semiconductor manufacture,

SUMMARY OF THE INVENTION

The primary objective of the present invention is to provide a new method of making a flash memory with simplified steps causing fewer layers of polysilicon and lowering the step height compared to the flash memory made by the conventional method.

In accordance with one aspect of the invention, there is provided a method for fabricating a high coupling ratio flash memory comprising the steps of forming a field oxide region and a gate oxide layer on the substrate; forming a silicon nitride layer on the gate oxide layer and defining a channel region under the gate oxide layer; forming two N$^-$ shallow doping regions beside the channel region; forming a tunnel layer on the surface of each N$^-$ shallow doping region; forming two insulator side wall layers respectively attached to two vertical sides of the silicon nitride layer and the gate oxide layer, with a portion of the tunnel oxide layer being covered by the two silicon nitride layers; removing a portion of the tunnel layer and leaving two very short tunnel oxide layers respectively covered by the two silicon nitride layers; forming two N$^+$ source/drain regions respectively adjacent to the N$^-$ regions which are under the very short tunnel oxide layers; forming a thick oxide layer on the N$^-$ source/drain region substantially between the field oxide region and the insulator side wall layers, removing the silicon nitride layer and the insulator side wall layer; forming a first polysilicon layer on a portion of the thick oxide layer and the gate oxide layer; forming a dielectric layer onto the surfaces of the field oxide region, the first polysilicon layer, and the thick oxide layer; and forming a second polysilicon layer on the dielectric layer.

Further objectives and advantages of the present invention will become apparent from a careful reading of the detailed description provided hereinbelow, with appropriate reference to the accompanying drawings.

DETAILED DESCRIPTION OF THE PREFERRED EMBODIMENT

Figure 1A:
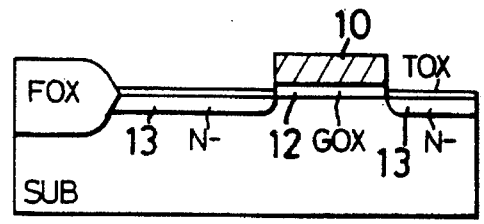
FIGS. 1A to 1D illustrate a new method for fabricating a high coupling ratio flash memory in accordance with the present invention.
Figure 1B:
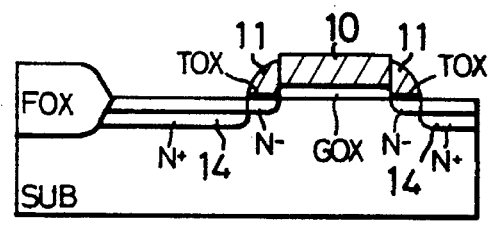
Figure 1C:
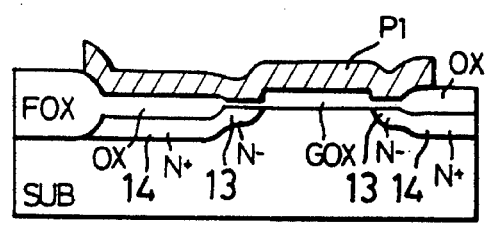

A method for fabricating a high coupling ratio flash memory with a very narrow tunnel layer is illustrated in FIGS. 1A to 1D. Firstly, form a channel region 12 as shown in FIG. 1A. A local field oxidation procedure is performed on a p-type substrate SUB to form a field oxide region FOX on the substrate SUB. A gate oxide layer GOX (substantially 300 Å) is then formed on the substrate SUB and a silicon nitride layer 10 is deposited on the gate oxide layer GOX. A photomask etching step is performed thus leaving the silicon nitride layer 10 and the gate oxide layer GOX leaving a distance from the field oxide region FOX, as shown in FIG. 1A. The channel region 12 is defined under the gate oxide region GOX. Secondly, perform an $N^-$ ion implanting procedure on the substrate SUB around the channel region 12 thus forming two $N^-$ shallow doping regions 13. Thirdly, grow a very thin tunnel oxide layer TOX (about 90 Å) on the surface of each $N^-$ shallow doping region 13. Fourthly, referring to FIG. 1B, form two insulator side wall layers 11 respectively attached to two vertical sides of the silicon nitride layer 10 and the gate oxide layer GOX via a silicon nitride deposition/reverse etching procedure, with a portion of the tunnel oxide layer TOX being covered by the two insulator side wall layers 11. It is noted that the insulator side wall layers 11 are made of silicon nitride. Fifthly, remove the tunnel oxide layer portions TOX which are not covered by the two insulator ( silicon nitride) side wall layers 11 and leaving two very short tunnel oxide layers TOX respectively covered by the two insulator side wall layers 11. Sixthly, perform an $N^+$ source/drain ions implanting procedure through the $N^-$ doping layer thus defining two $N^+$ source/drain regions 14 respectively adjacent to the $N^-$ region 13 which is under the very short tunnel oxide layers TOX. It is noted that the $N^+$ source/drain regions 14 has a deeper doping depth than that of the $N^-$ region 13. The $N^+$ source/drain regions 14 formed in this procedure is so called a low doping source/drain region (LDD). Seventhly, referring to FIG. 1C, form a thick oxide layer OX by a thermal oxidation step on the $N^+$ source/drain regions 14 substantially between the field oxide region FOX and the insulator (silicon nitride) side wall layers 11. Eighthly, remove the silicon nitride layer 10 and the insulator side wall layer 11. Ninthly, perform a deposition/photomask etching step to form a first polysilicon layer P1 as shown in FIG. 1C. Tenthly, referring to FIG. 1D, deposit a dielectric layer ONO onto the surfaces of the field oxide region FOX, the first polysilicon layer P1, and the thick oxide layer OX. Actually the dielectric layer ONO is formed by a silicon oxide layer, a silicon nitride layer, and an oxide layer. However, for simplicity of drawing, the three layers are not particularly illustrated in FIG. 1D. Eleventhly, perform a deposition/photomask etching step to form a second polysilicon layer P2 on the dielectric layer ONO. The second polysilicon layer P2 can be made of polysilicide.

Figure 1D:
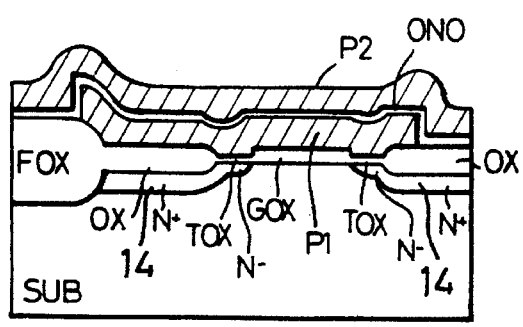
Figure 2A:
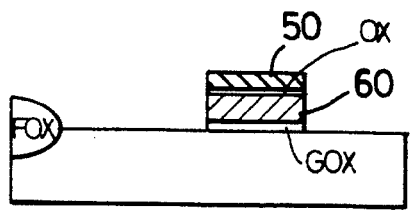
FIGS. 2A to 2F illustrate a conventional method for fabricating a high coupling ratio flash memory.
Figure 2B:
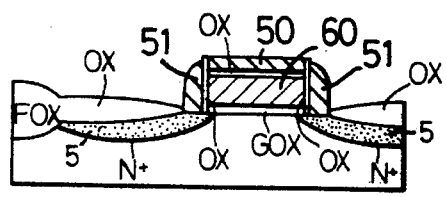
Figure 2C:
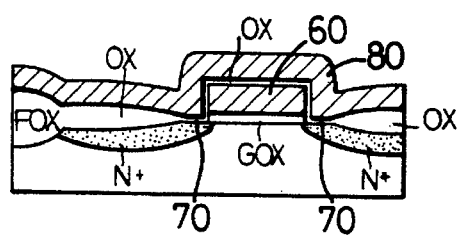
Figure 2D:
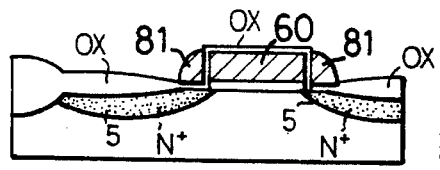
Figure 2E:
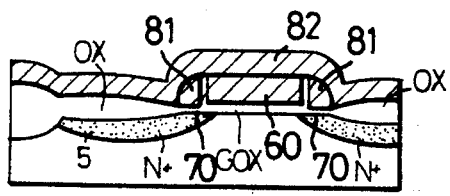
Figure 2F:
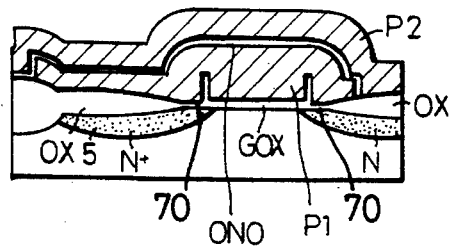

It will be appreciated from a view to FIG. 1D that the flash memory of this invention has a relatively high coupling ratio. Further referring to FIG. 1D, the first polysilicon layer (float gate) P1 faces to the very short tunnel oxide layer TOX corresponding to a position where the $N^-$ region 13 is located. The central portion which occupies most of the first polysilicon layer P1 faces to the substrate SUB via the very thick gate oxide layer GOX, therefore the parasitic capacitance between the first polysilicon layer P1 (float gate) and the substrate SUB is relatively decreased. Moreover, the first polysilicon layer P1 and the second polysilicon layer P2 have a relatively large surface opposite to each other yet separated by the dielectric layer ONO, therefore the coupling capacitance therebetween is relatively increased. From the above discussion, it can be appreciated that the coupling ratio of the flash memory as shown in FIG. 1D is relatively high.

The method for forming the flash memory with high coupling ratio is better than that of a conventional one in that the step for forming polysilicon layer in this invention is used twice while it is used four times in the conventional skill, and the resultant step height in forming the polysilicon layers in this invention is relatively lower than that of the conventional skill. Of course, the coupling ratio in this invention is substantially identical to that of the conventional flash memory.

While the present invention has been explained in relation to its preferred embodiment, it is to be understood that various modifications thereof will be apparent to those skilled in the art upon reading this specification. Therefore, it is to be understood that the invention disclosed herein is intended to cover all such modifications as fall within the scope of the appended claims.

I claim:

1. A method for fabricating a high coupling ratio flash memory comprising the steps of:

performing a local field oxidation step on a P-type substrate to form a field oxide region on the substrate;

forming a gate oxide layer on the substrate and depositing a silicon nitride layer on the gate oxide layer;

removing a portion of the gate oxide layer and the silicon nitride layer thus leaving the silicon nitride layer and the gate oxide layer to have a distance from the field oxide region thus defining a channel region under the gate oxide region;

implanting $N^-$ ions onto the substrate around the channel region, thus forming two $N^-$ shallow doping regions beside the channel region;

forming a very thin tunnel layer on the surface of each $N^-$ shallow doping region;

forming two insulator side wall layers respectively attached to two vertical sides of the silicon nitride layer and the gate oxide layer via a deposition/reverse etching step, with a portion of the tunnel layer being covered by the two insulator side wall layers;

removing the tunnel layer portions which are not covered by the two insulator side wall layers and leaving two very short tunnel layers respectively covered by the two insulator side wall layers;

implanting $N^+$ source/drain ions through the $N^-$ doping layer thus defining two $N^+$ source/drain regions respectively adjacent to the $N^-$ regions which are under the very short tunnel layers;

forming a thick oxide layer by a thermal oxidation step on the $N^+$ source/drain region substantially between the field oxide region and the insulator side wall layers;

removing the silicon nitride layer and the insulator side wall layers;

forming a first polysilicon layer on a portion of the thick oxide layer and the gate oxide layer by a deposition/photomask etching procedure;

depositing a dielectric layer onto the surfaces of the field oxide region, the first polysilicon layer, and the thick oxide layer; and, forming a second polysilicon layer on the dielectric layer by a deposition/photomask etching procedure.

2. The method as claimed in claim 1, wherein the insulator side wall layer are made of silicon nitride.

3. The method as claimed in claim 1, wherein the tunnel layer is an oxide layer.

4. The method as claimed in claim 1, wherein the tunnel layer has a width of 90 Å.

5. The method as claimed in claim 1, wherein the gate oxide layer has a width of 300 Å.

6. The method as claimed in claim 1, wherein the second polysilicon layer is made of polysilicide.

7. The method as claimed in claim 1, wherein the dielectric layer is formed by a silicon oxide layer, a silicon nitride layer, and an oxide layer.

* * * * *